(12) United States Patent
Rangarajan et al.

(10) Patent No.: US 6,210,846 B1
(45) Date of Patent: Apr. 3, 2001

(54) EXPOSURE DURING REWORK FOR ENHANCED RESIST REMOVAL

(75) Inventors: Bharath Rangarajan, San Clara; Ursula Q. Quinto, San Jose; Bhanwar Singh, Morgan Hill, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/373,571

(22) Filed: Aug. 13, 1999

(51) Int. Cl.$^7$ ................................. G03F 9/00; G03C 5/00
(52) U.S. Cl. ........................ 430/30; 430/328; 430/329; 430/331
(58) Field of Search .............................. 430/30, 328, 331, 430/329

(56) References Cited

U.S. PATENT DOCUMENTS

| | | | |
|---|---|---|---|
| 4,778,739 | 10/1988 | Protschka | 430/30 |
| 5,472,826 | 12/1995 | Endo et al. | 430/311 |
| 5,962,197 | * 10/1999 | Chen | 430/331 |

OTHER PUBLICATIONS

Patent Abstracts of Japan (Tamaoki Norihiko), vol. 1995, No. 11, Dec. 26, 1995.
Patent Abstracts of Japan (Ishikawa Yamato), vol. 1995, No. 12, Dec. 26, 1996.
IBM Technical Disclosure Bulletin, "Complete Removal of Reflow Baked Positive Photoresist with N–Butyl Acetate", vol. 28, No. 3, Aug. 1985.

IBM Technical Disclosure Bulletin, "Acetic Acid Spray Rinse for Removing Developed Resist Residuals From a Wafer Surface", vol. 32, No. 3A, Aug. 1989.

Wolf et al., Silicon Processing for the VLSI Era, vol. 1—Process Technology, (1986), pp. 517–537.

* cited by examiner

Primary Examiner—Christopher G. Young
(74) Attorney, Agent, or Firm—Foley & Lardner

(57) ABSTRACT

A resist removal method provides for analyzing a patterned resist and determining if rework needs to be performed due to the pattern being incorrect. If the pattern is incorrect, the an entire upper surface of the patterned resist is exposed to mild UV light. The exposed patterned resist is then subjected to a developer, such as an alkaline bath, such that the exposed patterned resist is dissolved away from the substrate, and such that a new layer of resist can be applied and then patterned.

18 Claims, 1 Drawing Sheet

EXPOSURE DURING REWORK FOR ENHANCED RESIST REMOVAL

BACKGROUND OF THE INVENTION

1. Field of the Invention

The present invention relates to resist removal for semiconductor substrates. In particular, the present invention relates to exposing resist prior to developing the resist, in order to remove the resist from the wafer, especially during rework.

2. Description of the Related Art

Clean wafers are very important in obtaining high yields for semiconductor fabrication. As described in Section 15 of Silicon Processing for the VLSI Era, Volume I, by S. Wolf and R. N. Tauber, there are two major sources of wafer contamination, particulates and films. Particulates are bits of material that are on the wafer surface, and can include silicon dust, quartz dust, atmospheric dust, and particulates from clean room personnel and processing equipment, just to name a few of the possible sources of particulate contamination. Film contamination corresponds to layers of foreign material on a wafer surface, and can include solvent residues, such as acetone, or photoresist developer residues from dissolved photoresist in the developer, just to name a few of the possible sources of film contamination.

The Wolf et al. reference states that "chemical cleaning and photoresist stripping operations used to remove film contamination have also been identified as significant sources of particle contamination." It is suggested in the Wolf et al. reference that "ultra-pure chemicals be utilized together with in-line point-of-use microfiltration for both chemical cleaning and resist stripping procedures."

The Wolf et al. reference discusses various techniques for photoresist removal, including etching (wet and dry), ion implantation, lift-off processes, high temperature postbake, or simple removal of misaligned resist patterns for reimaging after development and inspection ("rework"). The primary objection of resist removal is to insure that almost all of the photoresist is removed quickly as possible without harming any underlayers.

To perform this task, organic strippers have been utilized, such as phenol-based strippers. The problem with such strippers is that they will attack the metal underlayers, causing damage to the semiconductor substrate. Also, oxidizing-type strippers have been used, such as heated solutions of $H_2SO_4$ and an oxidant. Ammonium persulfate (APM) is typically used to maintain baths of consistent composition. As another alternative to resist removal, dry etching of resist can be performed, using oxygen plasmas in plasma etching equipment.

While each of the above-mentioned techniques for resist removal is effective to remove most of the resist, these removal techniques leave behind some resist or residue, or they damage the film underneath by undesired chemical reactions. In some cases, the temperature during oxygen plasma treatment is so high that it causes the underlying film to change. This detrimental situation due to the left-behind residue is highlighted upon deposition of a subsequent film, whereby the residues show up as bumps, which can result in yield loss.

SUMMARY OF THE INVENTION

The invention provides a resist removal method that can effectively remove a significant portion of a resist from a semiconductor substrate.

The invention also provides a resist removal method for increased yield during rework.

The invention also provides a resist removal method for lessening the amount of impurities caused by remaining resist on the substrate, so that upper layers may be formed without such impurities existing beneath the upper layers.

At least some of the above-mentioned advantages may be achieved by a resist removal method, which includes applying a resist to a semiconductor substrate. The method also includes patterning the resist by exposing a particular portion of the resist to light. The method further includes analyzing the patterned resist to determine if the resist was correctly patterned. If the resist was not correctly patterned, the patterned resist is exposed to light, and a developing solution is provided to the exposed patterned resist. As such, the exposed patterned resist is effectively removed from the semiconductor substrate.

At least some of the above-mentioned advantages may also be achieved by a method of removing a patterned resist from a semiconductor substrate. The method includes exposing the patterned resist to light. The method also includes providing a developing solution to the exposed patterned resist to thereby cause the exposed patterned resist to be removed from the semiconductor substrate.

BRIEF DESCRIPTION OF THE DRAWINGS

The invention will become more fully apparent from the following detailed description when read in conjunction with the accompanying drawings with like reference numerals indicating corresponding parts throughout, and wherein.

DETAILED DESCRIPTION OF THE PREFERRED EMBODIMENTS

Figure 1:
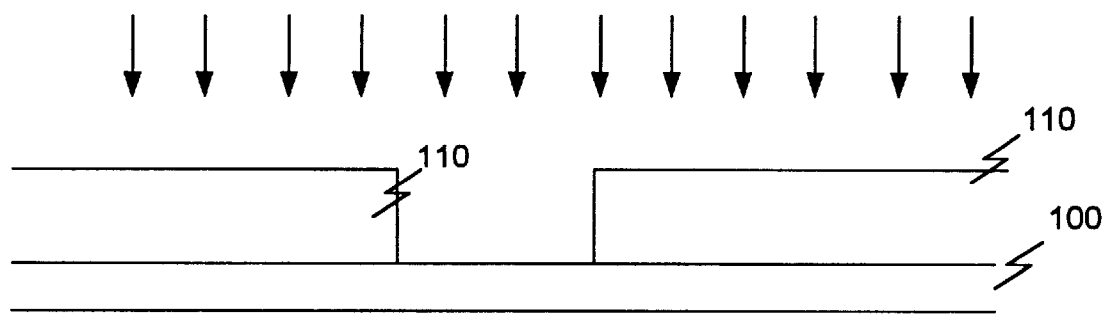
FIG. 1 illustrates an exposure step that is performed in a resist removal method according to the present invention.

Preferred embodiments of the present invention will be described in detail hereinbelow, with reference to the accompanying drawings. Creating an accurate photoresist image is an important part of semiconductor fabrication. In this regard, the creation of a mask for exposing only certain areas of a photoresist must be done precisely in order to create a desired photoresist pattern on the semiconductor substrate. If the photoresist has been inaccurately patterned, then the photoresist must be removed in a "rework" step in order to attempt the reapply the photoresist and pattern the photoresist again.

As discussed earlier, various techniques exist for removing the photoresist. Each of these techniques, however, leave behind some of the photoresist, as a residue or as particulates, which affect the yield of the wafer on which those particulates are disposed.

Accordingly, a first embodiment of the present invention provides a method for removing an improperly-formed photoresist pattern, so that a rework can be performing that does not result in a yield loss. In a photoresist application step, the entire substrate is coated with a photoresist. Then, certain areas of the photoresist are exposed to light, where those certain areas are exposed based on a mask that blocks light from affecting other areas of the photoresist that are not to be patterned. The areas of the photoresist that are exposed to light change their composition, in a manner similar to photographic film being exposed to light. As a result, when the mask is removed and the photoresist is placed in a developing solution, the exposed areas of the photoresist are rendered soluble, and are washed away from the substrate, while the unexposed areas of the photoresist remain on the photoresist. By this method, a photoresist pattern may be created on a semiconductor substrate, which can then be subject to other steps, such as ion implantation steps, in order to create semiconductor devices on the substrate.

In a first embodiment of the present invention, once a photoresist has been patterned, it is analyzed in order to determine if the photoresist pattern has been correctly formed on the substrate. Such analysis may be performed using high-magnification microscopes (e.g., electron-beam microscopes), and can be performed either automatically without user-interaction, or by a user viewing the magnified image in order to determine if the pattern has been placed correctly onto a top surface of a wafer. If the pattern has been placed correctly, then the substrate can be subjected to further steps (e.g., ion implantation step, via/trench formation step, etc.) in order to create semiconductor devices thereon.

However, if the pattern has not been placed correctly on the substrate, then the patterned photoresist must be removed from the substrate, and then the photoresist must be reapplied and then repatterned and analyzed, before further processing steps for creating semiconductor devices on the substrate can be performed.

In a second embodiment of the invention, which may occur after a resist removal rework according to the first embodiment has taken place on a substrate, or which may occur on a substrate in which a resist removal rework according to the first embodiment has not been taken place, after the resist pattern has been correctly formed, which may be determined by either automatic or manual inspection, the substrate is processed by ion implantation, via/trench formation, and the like, with the resist remaining on the substrate during those processes. Thereafter, the whole surface of the substrate is subjected to UV exposure to expose all portions of the resist. Then, the resist is removed from the substrate by placing the substrate in a developing solution, in a manner similar to the exposure/developing steps performed in the first embodiment.

The present invention provides for exposure of the entire patterned photoresist prior to any cleaning step, so as to subject the photoresist for easier removal and thereby leave little if any of the photoresist on the substrate. That way, whether or not a rework has to be performed beforehand, the removal of the photoresist can be performed so as to not create any significant residue on the substrate, thereby increasing yield as compared to conventional resist removal methods.

Referring now to FIG. 1, which shows a patterned photoresist 110 (which may be patterned by exposure to light through a mask, not shown, for example) provided on a wafer or semiconductor substrate 100, the entire patterned photoresist 110 is subjected to mild UV exposure (the exposure shown by the downward pointing lines in FIG. 1), to thereby prepare the photoresist in such a way that it can be readily removed from the substrate in a later developing step. The whole surface exposure step may be performed under ambient conditions. An exposure energy having a value between 10 to 50% greater than the light energy used to pattern a conventional photoresist can be used to sufficiently prepare the photoresist for the developing step to be performed after the exposure step. Preferably, the exposure energy range corresponds to an exposure energy that is more than what is conventionally used to expose photoresist in order to create a photoresist pattern, but not enough to cause crosslinking to occur. The time frame and environmental conditions for the exposure step are the same as what is done for a conventional exposure step in which a photoresist is patterned.

Various types of conventional resist formation/patterning methods are provided below, with the present invention providing UV exposure at a value that corresponds to a 10–50% greater dosage level than what is used in the conventional methods. The 10–50% range is the preferred range for UV exposure energy as compared to conventional UV exposure dosages. In an alternative configuration, the UV exposure dosage can be a value chosen within a range of from 20% less than the conventional UV exposure dosage, to 100% greater than the conventional UV exposure dosage. For resist #s 955, 508, 511, made by Shipley Corporation, light at a wavelength of 365 nm and at a dosage of from 150–500 $mJ/cm^2$ is provided for between 30 to 200 seconds. For resist #s PFI 32, PFI 88, and PFI 96, made by Sumitomo Corporation, light at a wavelength of 365 nm and at a dosage of from 150 to 450 $mJ/cm^2$ is provided for between 30 and 200 seconds. For resist #s UV5 and UV2 of Shipley Corporation, light at a wavelength of 248 nm and at a dosage of from 5 to 20 $mJ/cm^2$ is provided for between 20 and 60 seconds. For resist #SEPR 402 made by Shin Etsu Corporation, light at a wavelength of 248 nm and at a dosage of from 15 to 40 $mJ/cm^2$ is provided for between 20 to 60 seconds. For resist #TDUR P015 made by Tokyo Ohka Corporation, light at a wavelength of 248 nm and at a dosage of from 50 to 75 $mJ/cm^2$ is provided for between 20 to 60 seconds. For each of these conventional exposure methods, dosages in order of from three to four times the above-mentioned result in UV-induced crosslinking. The present invention operates below the high-dosage levels that cause crosslinking.

As an optional step for deep UV resists, the photoresist is baked at about 100° C. to complete the exposure, prior to subjecting the photoresist to a developing step. For example, in the present invention, DUV photoresists are preferably baked at a temperature between 80° C. and 140°C., to thereby thermally catalyze reactions in the exposed areas.

Figure 2:
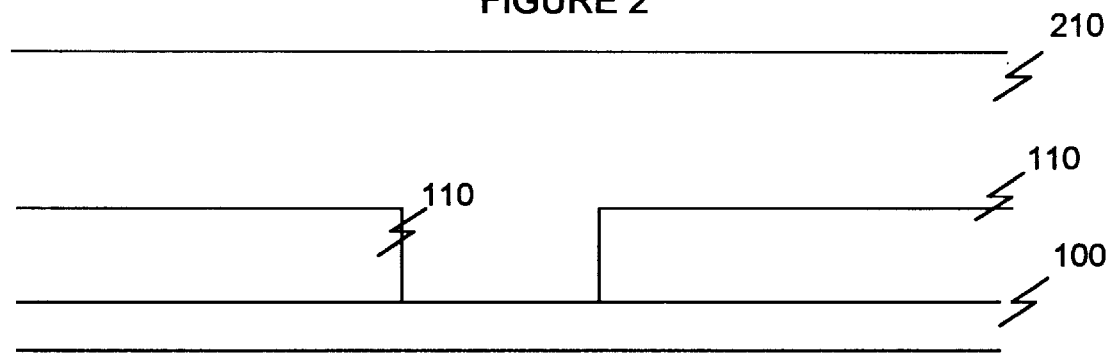
FIG. 2 illustrates a developer step that is performed in the resist removal method according to the present invention.
Figure 3:
FIG. 3 illustrates a wafer after the resist removal method of the present invention has been performed.

Once the photoresist has been exposed in accordance with the present invention, the photoresist 110 is subject to a developing step, which in the first embodiment corresponds to placing a substrate (with the photoresist patterned thereon) in an alkaline solution in a bath. FIG. 2 shows a developer 210 that is applied to the entire substrate, such that the photoresist 110 reacts with the developer, and is rendered soluble and dissolves or washes off the substrate, thereby leaving none of the photoresist 110 on the substrate 100. FIG. 3 shows the substrate 100 after the developing step, in which none of the photoresist remains on the substrate 100 due to the exposure and developing of the photoresist in accordance with the present invention.

For the developing step, an alkaline medium is preferred, such as a 0.26N (N=normality) tetramethyl ammonium hydroxide $(CH_3)_4NH_4OH$ (TMAH), but other types of alkaline solutions with any normality may be utilized (as well as using TMAH of a normality other than 0.26N), which have similar photoresist removal properties. The developing step is preferably performed for between 30 seconds and 10 minutes, at ambient conditions (e.g., room temperature), and where the alkaline solution may be applied by spraying onto the substrate, or by dipping the substrate into an alkaline bath. Alternatively, the developing step may involve dipping the substrate in an alkaline bath, followed by dipping the substrate in an acidic bath, such as $H_2SO_4$ or the like. In either of the first or second embodiments, the photoresist is rendered soluble by the exposure, and is dissolved away when subjected to the developer (or developers).

It is important that the photoresist is not overexposed during the exposure step, since that will result in a hardened photoresist that will not be rendered soluble when subjected to a developer/clean step. The parameters that result in a hardened photoresist are known to those skilled in the art and are not presented herein, in order to provide a concise explanation of the present invention.

The present invention is useful for removing positive resists, in which the areas of the resist that are exposed to light are rendered soluble when subjected to a developer solution. However, there is another type of resist, known as negative resist, in which areas not exposed to light are the areas in which the photoresist is formed, and areas not exposed to light form the gaps or patterns of the photoresist pattern. For negative resists, the method according to the present invention is not applicable, since the exposure step would be creating resist, as opposed to reacting with already-applied resist in order to make it soluble when dipped in a developing bath or the like.

The first embodiment of the present invention is useful for any lithographic process prior to etch. In particular, if the resist pattern is determined as not being acceptable, it can be removed in accordance with the first embodiment of the present invention, and then applied to the substrate again and repatterned.

Once the resist pattern has been correctly applied, further processing steps may be performed, such as ion implantation or via/trench formation, with the resist pattern remaining on the substrate during those processing steps. Thereafter, the resist pattern is removed by exposing the entire surface of the resist pattern to UV light, and then dipping the substrate in a developing solution, in accordance with the second embodiment. The exposure energy for the second embodiment is the same as that performed in the first embodiment, and the developer chemistry and environmental conditions for the second embodiment are the same as those performed during the developing step in accordance with the first embodiment.

The first embodiment of the present invention is also useful for certain critical steps such as metal masking, where, as described above, conventional rework processes leave residues which cause bumps, and thereby limit yield. Metal masking is where a mask resist is placed on top of a metal stack, and the removal of the mask resist may be performed in accordance with the present invention.

While preferred embodiments have been described herein, modification of the described embodiments may is become apparent to those of ordinary skill in the art, following the teachings of the invention, without departing from the spirit and scope of the invention as set forth in the appended claims.

For example, while the present invention has been described in detail with respect to the use of TMAH, other bases may be utilized, such as ammonium hydroxide, while remaining within the scope of the invention. Furthermore, there is even a benefit for providing mild UV exposure in accordance with the present invention, even before the conventional rework process.

What is claimed is:

1. A resist removal method, comprising:

applying a resist to a semiconductor substrate;

patterning the resist to form a patterned resist by exposing a particular portion of the resist to light;

analyzing the patterned resist to determine if the resist was correctly patterned, and if not, exposing the patterned resist to light; and providing a developing solution to the exposed patterned resist to thereby cause the exposed patterned resist to be removed from the semiconductor substrate, wherein the exposing of the patterned resist to light is performed at a light energy level that is at a value between 10 to 50% greater than a light energy level that is provided during the patterning of the resist.

2. The method according to claim 1, wherein the developing solution is an alkaline solution.

3. The method according to claim 2, wherein the alkaline solution is $(CH_3)_4NH4OH$.

4. The method according to claim 1, wherein the developing is performed at ambient conditions for between 30 seconds to 10 minutes.

5. The method according to claim 1, wherein the exposing of the patterned resist to light is performed at ambient conditions.

6. The method according to claim 4, wherein the exposing of the patterned resist to light is performed at ambient conditions.

7. The method according to claim 1, wherein the resist is a positive resist.

8. The method according to claim 1, wherein the providing of the developing solution comprises first providing the exposed patterned resist to an alkaline solution, and then providing the exposed patterned resist to an acidic solution.

9. The method according to claim 1, wherein, if the patterned resist has been correctly patterned, performing a subsequent step for forming a semiconductor device on the substrate prior to said providing step.

10. The method according to claim 1, wherein the exposing of the patterned resist to light is performed at a light energy level that is strong enough such that the patterned resist will be removed from the semiconductor substrate when exposed to the developing solution, but weak enough such that cross-linking does not occur in the patterned resist.

11. The method according to claim 1, further comprising:
before the providing step but after the exposing step, baking the exposed patterned resist to complete exposure of the exposed patterned resist,
wherein the baking is performed at a temperature between 80 degrees C. and 140 degrees C., and
wherein the baking step is only performed when the resist is a deep UV resist.

12. A method of removing a patterned resist from a semiconductor substrate, comprising:
exposing the patterned resist to light; and
providing a developing solution to the exposed patterned resist to thereby cause the exposed patterned resist to be removed from the semiconductor substrate,
wherein the exposing is performed at a light intensity that is at a value that is between 10–50% greater than a light intensity that was utilized in patterning the resist.

13. The method according to claim 12, wherein the developing solution is an alkaline solution.

14. The method according to claim 13, wherein the alkaline solution is $(CH_3)_4NH_4OH$.

15. The method according to claim 12, wherein the developing is performed at ambient conditions for between 30 seconds to 10 minutes.

16. The method according to claim 12, wherein the exposing of the patterned resist to light is performed at ambient conditions.

17. The method according to claim 12, wherein the resist is a positive resist.

18. The method according to claim 12, wherein the providing of the developing solution comprises first providing the exposed patterned resist to an alkaline solution, and then providing the exposed patterned resist to an acidic solution.

* * * * *